(12) United States Patent
Sin et al.

(10) Patent No.: US 7,110,289 B1
(45) Date of Patent: Sep. 19, 2006

(54) METHOD AND SYSTEM FOR CONTROLLING MRAM WRITE CURRENT TO REDUCE POWER CONSUMPTION

(75) Inventors: Kyusik Sin, Pleasanton, CA (US); Hugh Craig Hiner, Fremont, CA (US); Xizeng (Stone) Shi, Fremont, CA (US); William D. Jensen, Fremont, CA (US); Hua-Ching Tong, San Jose, CA (US); Matthew R Gibbons, Dublin, CA (US); Roberto Bez, Milan (IT); Giulio Casagrande, Milan (IT); Paolo Cappeletti, Milan (IT); Marco Pasotti, Pavia (IT)

(73) Assignees: Western Digital (Fremont), Inc., Fremont, CA (US); STMicroelectronics S.R.L., Milan (IT)

( * ) Notice: Subject to any disclaimer, the term of this patent is extended or adjusted under 35 U.S.C. 154(b) by 0 days.

(21) Appl. No.: 10/816,271

(22) Filed: Mar. 31, 2004

(51) Int. Cl.
  *G11C 11/15* (2006.01)
(52) U.S. Cl. .................. 365/173; 365/158; 365/171; 365/189.01; 365/189.04
(58) Field of Classification Search ................ 365/158, 365/171, 189.01, 189.04, 173
  See application file for complete search history.

(56) References Cited

U.S. PATENT DOCUMENTS

| | | | |
|---|---|---|---|
| 5,640,343 | A | 6/1997 | Gallagher et al. |
| 6,272,040 | B1 | 8/2001 | Salter et al. |
| 6,418,046 | B1 | 7/2002 | Naji |
| 6,552,928 | B1 | 4/2003 | Qi et al. |
| 6,687,178 | B1 | 2/2004 | Qi et al. |
| 2004/0109348 | A1* | 6/2004 | Ooishi ........................ 365/158 |

* cited by examiner

*Primary Examiner*—Anh Phung
*Assistant Examiner*—Pho M. Luu
(74) *Attorney, Agent, or Firm*—Jonathan E. Prejean, Esq.

(57) ABSTRACT

In a method and system for reducing power consumed by a magnetic memory, magnetic memory cells are coupled to a bit line and are associated with a plurality of digit lines. A bit line current is provided in the bit line. Digit currents are provided in parallel in the digit lines at substantially the same time as the bit line current. The digit and bit line currents allow the magnetic memory cells to be written to a plurality of states in parallel.

8 Claims, 4 Drawing Sheets

METHOD AND SYSTEM FOR CONTROLLING MRAM WRITE CURRENT TO REDUCE POWER CONSUMPTION

FIELD OF THE INVENTION

The present invention relates to magnetic memory systems, and more particularly to a method and system for controlling the current used in writing to a magnetic memory cell to improve power consumption.

BACKGROUND OF THE INVENTION

Magnetic memories are often used in storing data. One type of memory currently of interest utilizes magnetic tunneling junctions in the memory cells. A magnetic tunneling junction typically includes two ferromagnetic layers separated by a thin insulating layer. The insulating layer is thin enough to allow charge carriers to tunnel between the ferromagnetic layers. The resistance of the magnetic tunneling junction depends upon the orientation of the magnetic tunneling junctions.

FIGS. 1 and 2 depict a conventional memory array 1 using the conventional memory cell 2. The conventional array 1 is shown in FIG. 2 as including four conventional memory cells 2, labeled 2, 2', 2", and 2'" in FIG. 2. Each conventional memory cell 2, 2', 2", and 2'" includes a magnetic tunneling junction 10 and a transistor 40. The transistor 40 includes a drain 42, a source 46 and a gate 44. The memory cells 2, 2', 2", and 2'" are coupled to bit lines 20 and 20' and bit line selection 56 and to word line selection 54 via word lines 50 and 50'. The bit lines 20 and 20' are coupled to the magnetic tunneling junctions 10, while the word lines 50 and 50' are coupled to the gates 44 of the transistors 40. Also depicted are digit lines 30 and 30' which carry current that applies a field to the appropriate conventional memory cells 2, 2', 2", and 2'" during writing.

FIG. 3 depicts a conventional method 70 for writing to the memory cells 2, 2', 2", and 2'". A bit line current, $I_B$, is pulsed to the selected cell 2, 2', 2", or 2'" through the bit line 20 or 20' at the same time that a digit current, $I_D$, is pulsed through the appropriate digit line 30 or 30', via step 72. Thus, the write currents $I_B$ and $I_D$ are simultaneously provided to the selected cell in step 72. The direction of the digit current determines the orientation of the free layer in the magnetic tunneling junction 10 and, therefore, the state of the magnetic tunneling junction 10. For example, if the cell 2 is to be written, the write currents $I_B$ and $I_D$ are provided through the bit line 20 and the digit line 50, respectively. It is determined whether there are other cells 2, 2', 2", or 2'" to program, via step 74. If not, then the method 70 terminates. If there are other cells 2, 2', 2", or 2'" to program, then a new cell 2, 2', 2", or 2'" is selected, via step 76. Step 72 is then repeated to program the new cell.

Although the conventional memory array 1 and the conventional memory cells 2, 2', 2", and 2'" function, one of ordinary skill in the art will readily recognize that the power consumed using the conventional method 70 is relatively large. In particular, as described above, the bit line current and digit current are pulsed for each cell being programmed. Thus, assume that N cells are being programmed with a zero or a one, and the line voltages for the bit line 20 and 20' and the digit line 30 or 30' are $V_B$ and $V_D$, respectively. Also assume that the currents $I_D$ and $I_B$ are pulsed for a time, $\tau$. The energy required to switch N cells to the desired states is given by $N\tau(I_D V_D + I_B V_B)$. Because this relatively large amount of energy is consumed when programming the conventional memory array 1, battery life of a product using the conventional memory 1 may be less than desired.

Accordingly, what is needed is a system and method for providing a magnetic memory having improved power consumption. The present invention addresses such a need.

SUMMARY OF THE INVENTION

The present invention provides a method and system for reducing power consumed by a magnetic memory. A plurality of magnetic memory cells is coupled to a bit line and associated with a plurality of digit lines. The method and system comprise providing a bit line current in the bit line and providing digit currents for the plurality of magnetic memory cells in parallel in the corresponding digit lines at substantially the same time as the bit line current. The digit currents and the bit line current allow the plurality of magnetic memory cells to be written to multiple states in parallel.

According to the system and method disclosed herein, the present invention provides a magnetic memory that consumes less power during programming.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for reducing power consumed by a magnetic memory. A plurality of magnetic memory cells is coupled to a bit line and associated with a plurality of digit lines. The method and system comprise providing a bit line current in the bit line and providing digit currents for the plurality of magnetic memory cells in parallel in the corresponding digit lines at substantially the same time as the bit line current. The digit currents and the bit line current allow the plurality of magnetic memory cells to be written to multiple states in parallel.

The present invention will be described in terms of a particular memory array having certain magnetic memory cells. However, one of ordinary skill in the art will readily recognize that this method and system will operate effectively for other memory arrays having other or additional components in the magnetic memory cells not inconsistent with the present invention.

Figure 4:
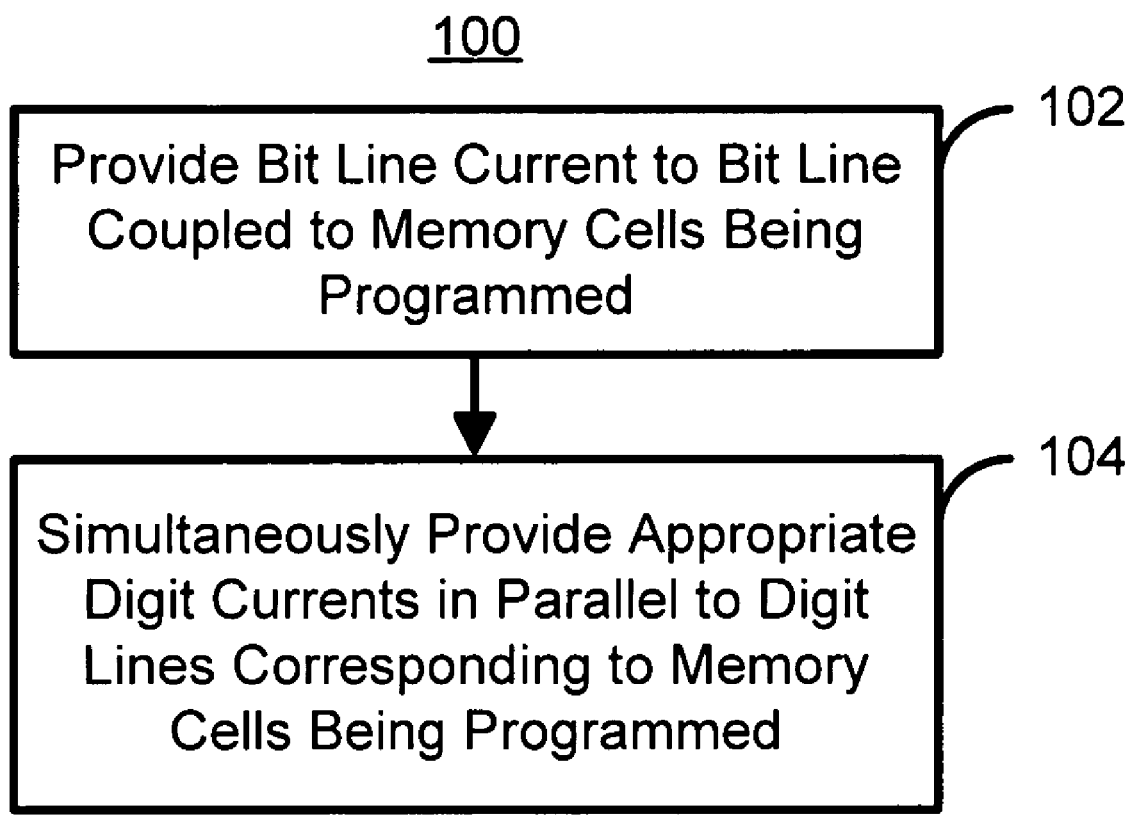
FIG. 4 is a high level flow chart depicting a first embodiment of a method in accordance with the present invention for programming memory cells in a magnetic memory array.
Figure 5:
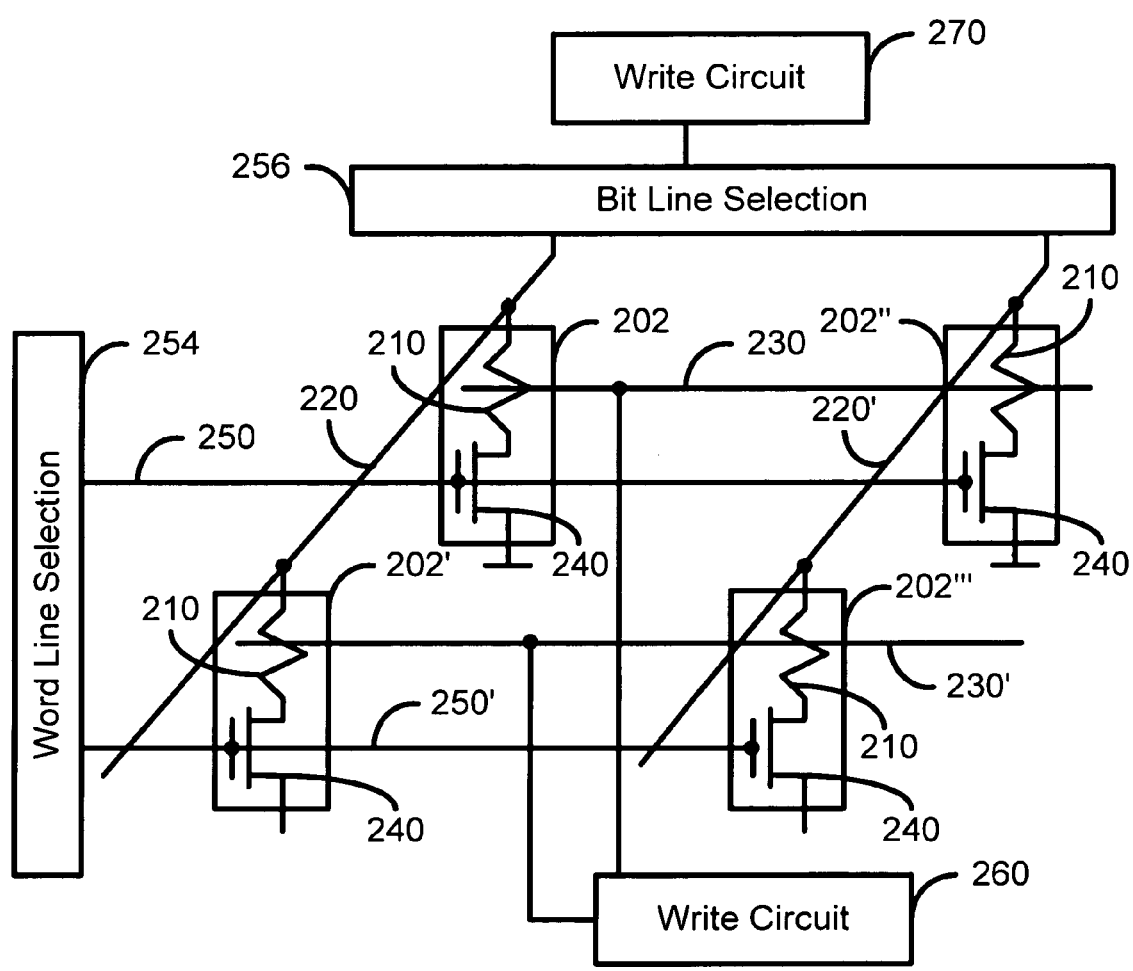
FIG. 5 is a block diagram depicting a first embodiment of a system in accordance with the present invention for programming memory cells in a magnetic memory array.

To more particularly illustrate the method and system in accordance with the present invention, refer now to FIGS. 4 and 5. FIG. 4 depicts one embodiment of a method 100 in accordance with the present invention for programming memory cells in a magnetic memory array. FIG. 5 depicts one embodiment of a memory 200 in accordance with the present invention. The method 100 is described in the context of the memory 200.

Figure 1:
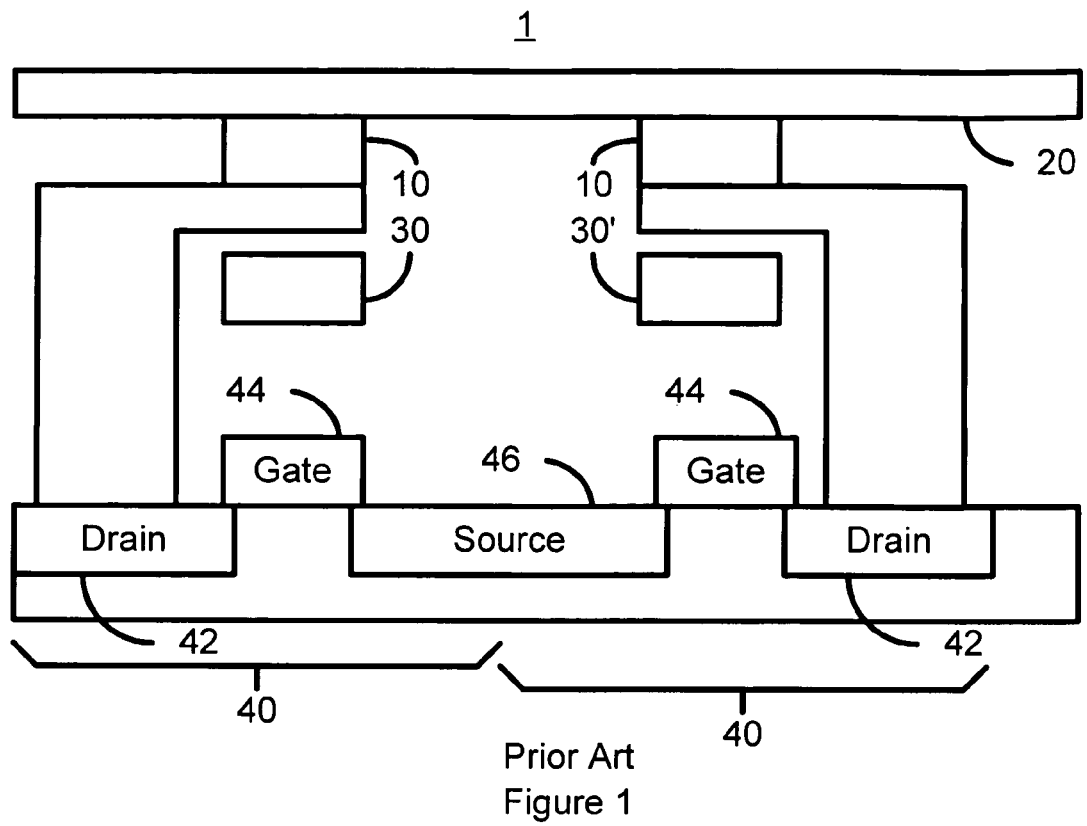
FIG. 1 is a diagram of a portion of a conventional magnetic memory array.
Figure 3:
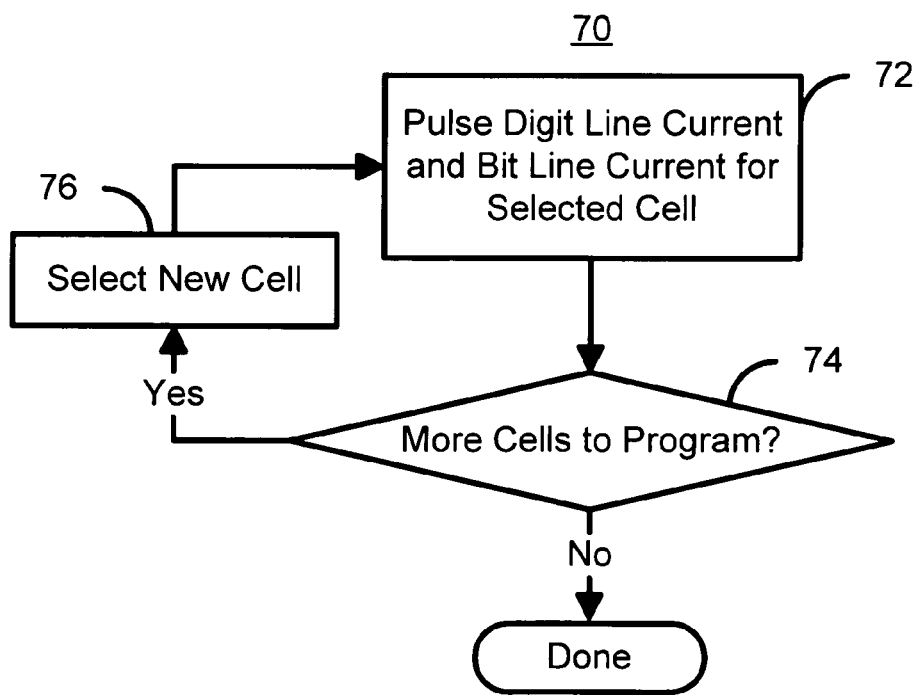
FIG. 3 is a flow-chart depicting a conventional method for programming memory cells in the magnetic memory array.
Figure 2:
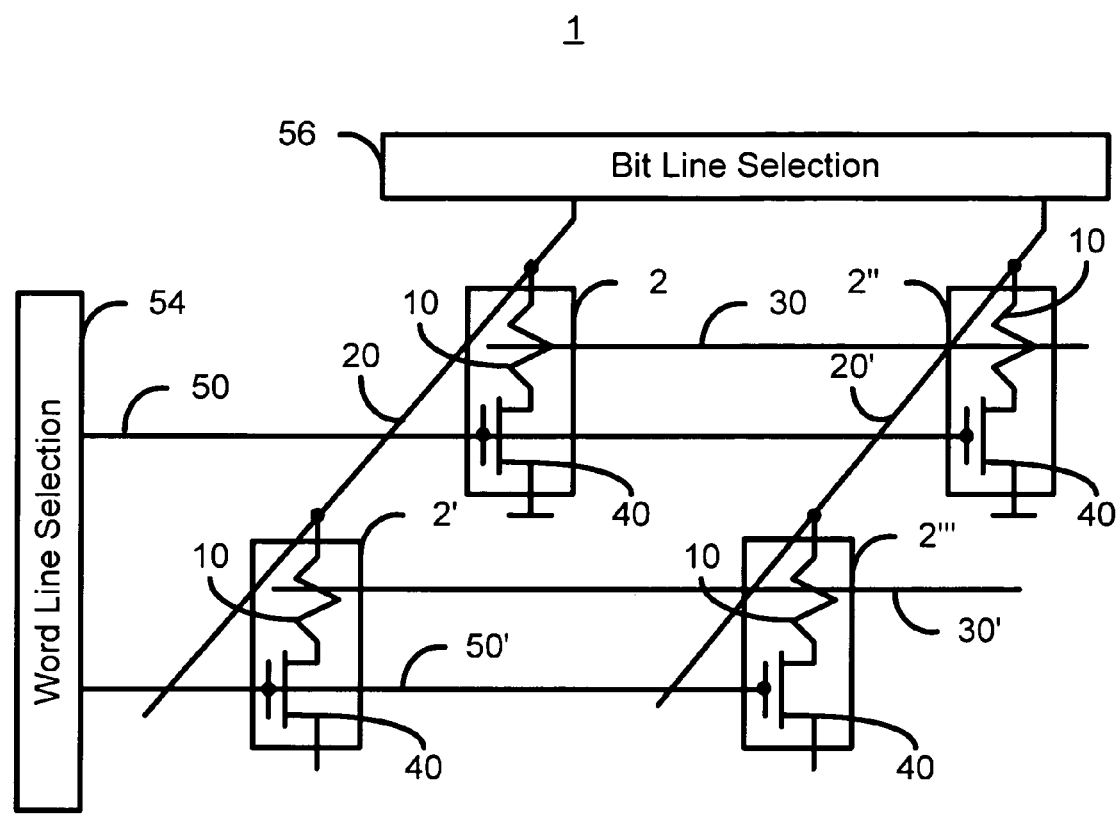
FIG. 2 is another diagram of a portion of a conventional memory array.

However, nothing prevents the use of another memory array. The memory 200 is shown in FIG. 5 as including four memory cells 202, 202', 202", and 202'". Each memory cell 202, 202', 202", and 202'" includes a magnetic tunneling junction 210 and a transistor 240. Thus, each memory cell 202, 202', 202", and 202'" is analogous to the conventional memory cells 2, 2', 2", and 2'" depicted in FIG. 2. The memory cells 202, 202', 202", and 202'" are coupled to bit lines 220 and 220' and bit line selection 256 and to word line selection 254 via word lines 250 and 250'. The bit lines 220 and 220' are coupled to the magnetic tunneling junctions 210, while the word lines 250 and 250' are coupled to the gates of the transistors 240. Also depicted are digit lines 230 and 230' which carry current that applies a field to the appropriate conventional memory cells 202, 202', 202", and 202'" during writing. In addition, write circuits 260 and 270 are also depicted. The write circuits 260 and 270 supply the digit and bit line currents, respectively. The write circuit 260 is capable of driving currents in multiple directions (e.g. left to right or right to left as seen in FIG. 5) at the same time for different digit lines 230 and 230'. However, in an alternate embodiment, another number of write circuits might be used. For example, instead of a single write circuit 260, two write circuits might be used for the digit lines 230 and 230'. In such an embodiment, each write circuit would drive a current in a single direction such that digit currents could still be simultaneously driven in different directions through the digit lines 230 and 230'.

The method 100 is used to write to the memory cells coupled with a particular bit line. For example, the method 100 would be used to program the cells 202 and 202' or 202" and 202'" at a time. For clarity, the method 100 is described as programming the cells 202 and 202' coupled with the bit line 220. A bit line current, $I_B$, is provided to the bit line 20 associated with the cells 2 and 2' being programmed, via step 102. Step 102 is preferably performed using the bit line selection 256 and write circuit 270 to provide the bit line current to the appropriate bit line 220. In a preferred embodiment, the write circuit 270 pulses the bit line current for the time, $\tau$, in order to program the cells 202 or 202'.

The appropriate digit current, $I_D$, is provided in parallel to each of the digit lines 230 and 230' at substantially the same time as the bit line current is provided to the bit line 230 to allow the cells 202 and 202' to be simultaneously written to different states, via step 104. Step 104 is preferably performed by using the write circuit 260 to drive the appropriate digit currents to the digit lines 230 and 230' in parallel and, therefore, substantially simultaneously. In a preferred embodiment, the digit current is pulsed to the digit line 230 and 230' for the time, $\tau$, at substantially the same time as the bit line current is pulsed, also for a time $\tau$, through the bit line 220. However, in practice, the digit line currents are pulsed to the digit lines 230 and 230' for a somewhat different amount of time as the bit current. Each digit line 230 and 230' can carry a different current in step 104. In a preferred embodiment, the current carried by each digit line 230 and 230' in step 104 depends upon the information to be written. In particular, the digit lines 230 and 230' can carry digit currents that are opposite in sign when a zero is to be written into one of the cells 202 or 202' while a one is to be written in the other cell 202' or 202, respectively. Thus, using the method 100, the cells 202 and 202' are programmed essentially together even if the cells 202 and 202' are being programmed to different states.

For example, suppose that a logical one is to be written to the cell 202, while a zero is to be written to cell 202'. In such a case, the bit line current is provided through the bit line 220 in step 102. At substantially the same time, the write circuit 260 would then provide opposite currents in the digit lines 230 and 230' in step 104. Thus, the digit line 230 may carry a current from right to left as depicted in FIG. 5, while the digit line 230' would carry a current from left to right as depicted in FIG. 5. Consequently, the method 100, particularly when implemented by the system 200, would allow simultaneous writing of memory cells 202 and 202' connected to a bit line 220 to different states.

Assume that the line voltages on the digit lines 230 and 230' and bit line 220 or 220' are $V_D$ and $V_B$, respectively, and that the currents are provided for a time during writing, $\tau$. Note that in practice, the currents are provided for somewhat different times in the bit line 220 or 220' and the digit lines 230 and 230'. For example, the current may be provided in the bit line 220 or 220' for two nanoseconds, while the current in the digit lines 230 and 230' are provided for 1.6 nanoseconds. However, the two currents are both provided together for the time $\tau$. Thus, the energy to write to N magnetic memory cells is $\tau(NI_DV_D+I_BV_B)$ when the method 100 is used. As discussed above, the energy required to write to N bits using a conventional method is $N\tau(I_DV_D+I_BV_B)$. Consequently, using the method 100, less energy is required to program a given number of bits with the desired data. Consequently, the method 100 can more efficiently program a magnetic memory such as the magnetic memory 1.

A method and system has been disclosed for more efficiently programming magnetic memory cells. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for programming a plurality of magnetic memory cells, the plurality of magnetic memory cells being coupled to a bit line, the plurality of magnetic memory cells being associated with a plurality of digit lines, the method comprising the steps of:

(a) providing a predetermined bit line current $I_B$ in the bit line at a predetermined bit line voltage $V_B$; and (b) providing a plurality of predetermined digit currents $I_D$ in parallel in the plurality of digit lines at a predetermined digit line voltage $V_D$ for the plurality of magnetic memory cells at substantially the same time as the bit line current $I_B$, the plurality of digit currents and the bit line current allowing the plurality of magnetic memory cells to be written to a plurality of states in parallel, wherein the total power supplied to the plurality of magnetic memory cells during writing is $I_BV_B+NI_DV_D$, where N is the number of digit lines.

2. The method of claim 1 wherein the bit line current is applied for a first predetermined time and the plurality of digit currents is provided for a second predetermined time.

3. The method of claim 2 wherein the first predetermined time is two nanoseconds.

4. The method of claim 3 wherein the second predetermined time is 1.6 nanoseconds.

5. A magnetic memory comprising:
a plurality of magnetic memory cells
a bit line, the plurality of magnetic memory cells being coupled to the bit line;
a plurality of digit lines, the plurality of magnetic memory cells being associated with the plurality of digit lines;
at least one write circuit configured to provide a predetermined bit line current $I_B$ in the bit line at a predetermined bit line voltage $V_B$ and to provide a plurality of predetermined digit currents $I_D$ in parallel in the plurality of digit lines at a predetermined digit line voltage $V_D$ in parallel at substantially the same time as the bit line current $I_B$, the plurality of digit currents and the bit line current allowing the plurality of magnetic memory cells to be written to a plurality of states in parallel, wherein the total power supplied to the plurality of magnetic memory cells during writing is $I_B V_B + N I_B V_D$, where N is the number of digit lines.

6. The magnetic memory of claim 5 wherein the bit line current is applied for a first predetermined time and the plurality of digit currents is provided for a second predetermined time.

7. The magnetic memory of claim 6 wherein the first predetermined time is two nanoseconds.

8. The magnetic memory of claim 7 wherein the second predetermined time is 1.6 nanoseconds.

* * * * *